United States Patent
Förster et al.

(10) Patent No.: US 7,924,065 B2
(45) Date of Patent: Apr. 12, 2011

(54) CONTROL CIRCUIT FOR A POWER FIELD-EFFECT TRANSISTOR AND METHOD FOR CONFIGURING A CONTROL CIRCUIT FOR A POWER FIELD-EFFECT TRANSISTOR

(75) Inventors: Ralf Förster, Regensburg (DE); Marco Well, Regensburg (DE); Gunther Wolfarth, Regensburg-Harting (DE)

(73) Assignee: Continental Automotive GmbH, Hannover (DE)

( * ) Notice: Subject to any disclaimer, the term of this patent is extended or adjusted under 35 U.S.C. 154(b) by 193 days.

(21) Appl. No.: 12/175,049

(22) Filed: Jul. 17, 2008

(65) Prior Publication Data
US 2010/0014202 A1   Jan. 21, 2010

(51) Int. Cl.
*H03K 3/00* (2006.01)
(52) U.S. Cl. ............................ 327/108; 327/112; 326/83
(58) Field of Classification Search .................. 327/108, 327/112; 326/82, 83
See application file for complete search history.

(56) References Cited

U.S. PATENT DOCUMENTS

| | | | | |
|---|---|---|---|---|
| 5,134,311 A * | 7/1992 | Biber et al. | ............. | 327/108 |
| 5,264,736 A * | 11/1993 | Jacobson | ............. | 327/365 |
| 5,390,070 A * | 2/1995 | Niedermeier | ............. | 361/152 |
| 5,828,247 A | 10/1998 | Moller et al. | ............. | 327/110 |
| 6,023,175 A * | 2/2000 | Nunomiya et al. | ............. | 326/68 |
| 6,064,226 A * | 5/2000 | Earl | ............. | 326/68 |
| 6,472,910 B2 * | 10/2002 | Niimi | ............. | 327/108 |
| 6,825,692 B1 * | 11/2004 | Chung et al. | ............. | 326/68 |
| 7,382,168 B2 * | 6/2008 | Bhattacharya et al. | ....... | 327/112 |
| 7,602,229 B2 * | 10/2009 | Tolle et al. | ............. | 327/440 |
| 7,649,722 B2 * | 1/2010 | Thijs et al. | ............. | 361/56 |

FOREIGN PATENT DOCUMENTS
EP     0645889     3/1995
* cited by examiner

*Primary Examiner* — Kenneth B. Wells
(74) *Attorney, Agent, or Firm* — King & Spalding L.L.P.

(57) ABSTRACT

An integrated circuit has a control circuit (2) for a power field-effect transistor (3), wherein the integrated circuit has a first input (202) for receiving a control signal (CE) and an output to switch the field-effect transistor (3) on or off. The control circuit further has a driver circuit for providing a voltage level at the output in response of the control signal. A second input is provided for receiving a configuration signal, the configuration signal for configuring the voltage level being provided by the driver circuit in response to the control signal.

20 Claims, 4 Drawing Sheets

US 7,924,065 B2

CONTROL CIRCUIT FOR A POWER FIELD-EFFECT TRANSISTOR AND METHOD FOR CONFIGURING A CONTROL CIRCUIT FOR A POWER FIELD-EFFECT TRANSISTOR

TECHNICAL FIELD

The invention relates to control circuit for a power field-effect transistor and a method for configuring a control circuit for a power field-effect transistor (FET).

BACKGROUND

Power field-effect transistors are characterized by a high stability against high voltages and high currents. While power transistors are integrated in integrated circuits, the control circuits, which switch on and off the power transistors, are often integrated in separate integrated circuits to limit the temperature of the integrated circuits. Power transistors may be of different types, e.g. n-channel or p-channel-type and may have additional protection circuitry. These power transistors with protection circuitry are called protected field-effect transistors.

Power MOSFET (metal oxide semiconductor field effect transistors) transistors are specified by an upper limit for the gate-source voltage. If a user chooses a wrong control circuit or the wrong voltage supply, the power MOSFET transistor may be destroyed.

SUMMARY

A control circuit for a power field-effect transistor is provided, whereby the risk of choosing a wrong control circuit is reduced.

According to an embodiment, an integrated circuit may comprise a control circuit for a power field-effect transistor, the integrated circuit comprising: a first input for receiving a control signal, an output to switch the field-effect transistor on and off, a driver circuit for providing a voltage level at the output in response to the control signal, and a second input for receiving a configuration signal, the configuration signal for configuring the voltage level being provided by the driver circuit in response to control signal.

According to a further embodiment, the integrated circuit may further comprise a third input for receiving a feedback signal from a terminal of the field-effect transistor. According to a further embodiment, the configuration signal may provide the information about the type of field-effect transistor. According to a further embodiment, the second input may receive a serial bus signal. According to a further embodiment, the integrated circuit may further comprise a diagnosis circuit being connected to the third input and being configured to measure the current through the load or the voltage of the load, the load being driven by the field-effect transistor. According to a further embodiment, the integrated circuit may further comprise a first protection device for preventing undershoots at the output of the driver circuit, being selectively coupled between a first power supply and the output of the driver circuit, and a second protection device for preventing overshoots at the output of the driver circuit, being selectively coupled between a second power supply and the output of the driver circuit. According to a further embodiment, the selection of the first protection device may be coupled to a first power supply and the output of the driver circuit, and the selection of the second protection device coupled between a second power supply and the output of the driver circuit, may be configurable by the configuration signal. According to a further embodiment, the integrated circuit may comprise a push-pull stage, with a push transistor to couple the output to a first supply node, and a pull transistor to couple the output to a second supply node. According to a further embodiment, the integrated circuit may comprise a non-volatile memory to store the configuration of the voltage level being driven by the driver circuit in response to control signal.

According to another embodiment, an electronic circuit may comprise such an integrated circuit, and may further comprise a power MOSFET transistor having a gate, a source and a drain, the gate being coupled to the output of the integrated circuit.

According to a further embodiment, the voltage level at the output of the control circuit may be programmed so that the gate-source voltage UGS that if the transistor is switched on, one of the conditions selected from the group consisting of: (I) $8V \leq UGS \leq 10V$, and (II) $-10V \leq UGS \leq -8V$, holds.

According to yet another embodiment, a method for configuring a control circuit for a power MOSFET-transistor, may comprise the steps of: providing such an electronic circuit and programming the voltage levels at the output of the control circuit by applying a configuration signal at the second input of the control circuit.

BRIEF DESCRIPTION OF THE DRAWINGS

Embodiments of the invention are demonstrated by the help to the figures, whereby.

DETAILED DESCRIPTION

Figure 1:
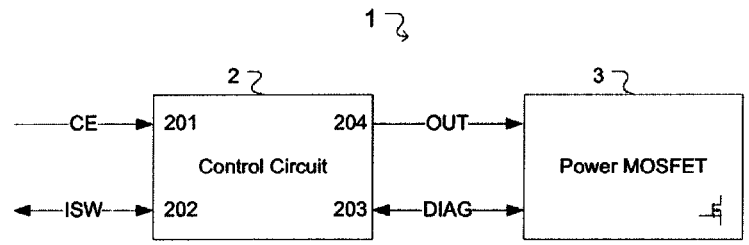
FIG. 1 shows an electronic circuit comprising a control circuit and a field-effect transistor.

An integrated circuit is provided comprising a control circuit for a power field-effect transistor, the integrated circuit comprising a first input for receiving a control signal and an output to switch the field-effect transistor on or off. The control circuit further comprises a driver circuit for providing a voltage level at the output in response to the control signal. A second input is provided for receiving a configuration signal, the configuration signal for configuring the voltage level being provided by the driver circuit in response to the control signal.

The proposed control circuit enables driving of control terminals of field-effect transistors (FET's), whereby the voltage level is configurable. If, e.g., the voltage levels are configured for a p-channel transistor, a low voltage level at the output switches the transistor on. In contrast, in an n-channel configuration, a high voltage level switches the transistor on. It is also possible to adapt the voltage levels to the load configuration of transistor, e.g., if the transistor is switched as a high-side switch or a low-side switch.

The control of the external transistor with a programmable push-pull stage:
- is all-purpose for the control for p-channel and n-channel transistors,
- can easily be applied as the integrated circuit is configurable by software,
- helps to reduce the number of components due to the integrated generic solution,
- reduces the time by using the same solution for different applications, and
- reduces the costs by the integration of the control circuit.

In an embodiment, the integrated circuit comprises a third input for receiving a feedback signal from a terminal of the field-effect transistor. By the help of this feedback signal, for example, over-current conditions may be detected to switch the transistor off again.

If the second input is configured for receiving serial bus signals, the number of input pins may be reduced. As the configuration is fixed in the application, the time required for the configuration is not so critical.

In an embodiment, the integrated circuit comprises a diagnosis circuit being connected to the third input and being configured to measure the current through the load or to measure the voltage at the load, the load being driven by the field-effect transistor. The diagnosis circuit may be used to check whether the transistor is still functional or if there are conditions which may destroy the transistor. The diagnosis circuit usually also checks if the load is still connected and controllable in a safe operation condition.

In a further embodiment, a first protection device is provided for preventing undershoots at the output of the driver circuit. The first protection device is coupled between the first power supply and the output of the driver circuit. A second protection device is provided for preventing overshoots at the output of the driver circuit. The second protection device is coupled between the second power supply and the output of the driver circuit. The protection devices protect the gates of the field-effect transistor and can selectively be provided, if they are needed especially for the p-channel or especially for the n-channel transistor.

The integrated programmable gate protection circuit for external transistors
- is all-purpose for the protection of p-channel/n-channel transistors,
- can easily be used as the integrated circuit is configurable by software,
- helps to reduce the number of components due to the integrated generic solution,
- reduces the time by using the same solution for different applications, and
- reduces costs by the integration of the control circuit.

In an embodiment, the integrated circuit comprises a push-pull stage, having a push transistor to couple the output to a first supply node and a pull transistor to couple the output to a second supply node.

If the integrated circuit comprises a non-volatile memory to store the configuration of the voltage level being driven by the driver circuit in response to control signal, the configuration does not need to be repeated, if the integrated circuit is disconnected from the power supply.

According to further embodiments, an electronic circuit may comprise an above-described integrated circuit and a power MOSFET transistor having a gate, a source and a drain. The gate is coupled to the output of the integrated circuit.

According to yet another embodiment, a method for configuring a control circuit for a power MOSFET-transistor, may comprise the steps of: providing the electronic circuit described above, and programming the voltage levels at the output of the control circuit by applying a configuration signal at a second input of the control circuit.

FIG. 1 shows an electronic circuit 1 with a power MOSFET-transistor 3 and a control circuit 2 for this power MOSFET-transistor 3. The control circuit 2 receives at a first input 201 a control signal CE. This control signal CE indicates if the MOSFET-transistor 3 should be switched on or off. The control circuit 2 comprises a second input 202 for receiving a configuration signal ISW. The configuration signal ISW may be supplied by a directional serial bus.

The input 202 is a software-interface, by which the configuration of the MOSFET type is programmed. The different types are: n-channel transistor, p-channel transistor and logic level transistor. By the signal ISW, additional information on how to measure the load being driven by the MOSFET-transistor 3 may be programmed into the control circuit 2. The load may be, e.g., a heating for the lambda sensor of a combustion machine.

The output 204 of the control circuit 2 supplies the control input of the transistor 3. The control input of the transistor 3 may be the gate terminal of an n-channel or a p-channel transistor. The output may also drive a control input of the transistor 3 that is coupled to the gate through additional circuitry, if transistor 3 is a so-called logic level transistor. A logic level transistor comprises not only the transistor itself but also further components that protect the transistor. Such transistors are also called "protected FET's" or "smart FET's". In the case of the protected FET's, the control input of the transistor 3 is the input for circuitry which controls the gate of the transistor 3.

At its output 204, the control circuit 2 supplies the transistor 3 with the required electrical voltage level and the required driving current.

At the input 203, the control circuit 2 receives a feedback signal DIAG for measuring purposes.

Figure 2:
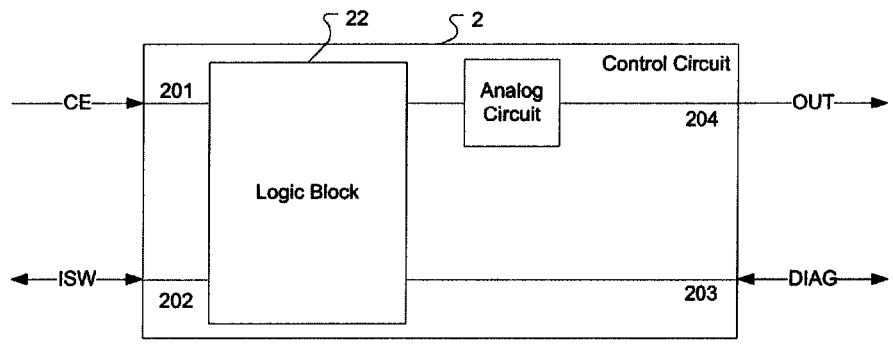
FIG. 2 shows details of the control circuit of FIG. 1.

FIG. 2 shows details of the control circuit shown in FIG. 1. The control circuit 2 is divided into an analog circuit part 20 and a logic block 22. The logic block 22 receives the control signal CE, the configuration signal ISW and the feedback signal DIAG. The logic block 22 controls the analog circuit part 20, which drives the output signal at the output 204.

Figure 3:
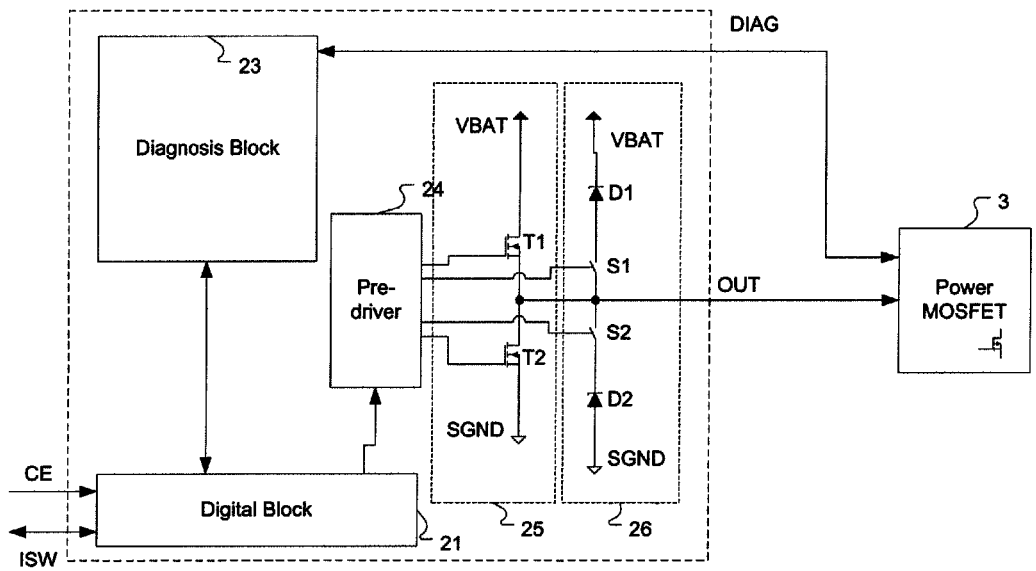
FIG. 3 shows further details of the control circuit of FIG. 1.

FIG. 3 shows further details of the electronic circuit 1 of FIG. 1. The control circuit 2 comprises a digital block 21, a diagnosis block 23, a pre-driver 24, a push-pull stage 25 and a programmable gate protection 26. The diagnosis block 23 receives the feedback signal DIAG and is bidirectionally connected to the digital block 21. The digital block 21 controls the pre-driver 24.

The push-pull stage 25 comprises a first n-channel MOSFET-transistor T1 and a second n-channel MOSFET-transistor T2. Transistors T1 and T2 are connected in series, such that the source of the second transistor T2 is connected to ground 36, while its drain is connected to the source of the first transistor T1, of which the drain is connected to the supply node VBAT. The output 204 is connected to the source of the first transistor T1. The gates of the first transistor T1 and the second transistor T2 of the push-pull stage are driven separately by the pre-driver 24.

The gate protection 26 comprises a first zener diode D1, a first switch S1, a second switch S2 and a second zener diode D2. These components D1, S1, S2 and D2 are connected in series, such that the cathode of the first zener diode D1 is connected to the supply node VBAT, the anode of the first zener diode D1 is connected to a first terminal of the first switch S1. The second terminal of the first switch S1 is connected to a first terminal of the second switch S2. The cathode of the second zener diode D2 is connected to the second terminal of the second switch S2. The anode of the second zener diode D2 is connected to ground 36. The output 204 is connected the second terminal of the first switch S1. The gate protection 26 may also be implemented with transistors or other complex circuitry. The control terminals of the first switch S1 and of the second switch S2 of the push-pull stage are driven separately by the pre-driver 24.

Table 1 shows how the pre-driver 24 is programmed in response to the configuration signal ISW. If the configuration signal ISW configures the pre-driver 24 for an n-channel transistor type, the first transistor T1 and the second switch S2 are switched on, if the control signal CE indicates that the transistor 3 should be switched on. If the control signal CE indicates that the transistor should be switched off, the second transistor T2 and the second switch S2 are switched on, while the first transistor T1 and the first switch S1 are switched off.

| type of Transistor | Signal CE | T1 | T2 | S1 | S2 |
|---|---|---|---|---|---|
| n-channel | ON | ON | OFF | OFF | ON |
|  | OFF | OFF | ON | OFF | ON |
| p-channel | ON | OFF | ON | ON | OFF |
|  | OFF | ON | OFF | ON | OFF |

For a p-channel transistor, the second transistor T2 and the first switch S1 are switched on, if the control signal CE drives the control circuit to switch the p-channel on. In this case the first transistor T1 and the second switch 52 are switched off.

If the control signal CE outputs a signal to switch the transistor off, the first transistor T1 and the first switch S1 are switched off, whereas the second transistor T2 and the second switch S2 are switched off. If the transistor T1 is switch on, a voltage level not higher than 10 V, is provided at the output 204 in case of an n-channel configuration. If the second transistor T2 is switched on, a voltage level of zero is provided at the output 204 in case of an n-channel configuration. A voltage of not less than −10V of gate-source voltage is provided in case of a p-channel configuration.

The level of the output voltage, which is the interface to the external transistor 3, is selected such that the gate-source voltage of the external transistor 3 in the range +8 to 10V or in the range −8 to −10 V for voltage supplies >8V. For battery voltages lower than 8V, a voltage drop through the driver stage smaller than 0.5V is guaranteed in order to maintain the transistor on-condition down to a system voltage of 0.5V. This enables the control of older transistor generations as well as the control of newer transistor generations of which the maximum gate-source voltage is at +/−20V. This has the advantage that several transistor generations and transistor types can be controlled without the need of additional circuitry.

If the first switch S1 is closed, the first zener diode D1 provides protection of the output 204 against undershoots because the zener diode D1 limits the voltage at the output 204 to a minimum voltage of −10V below VBAT. Accordingly, if the second switch S2 is closed, the maximum voltage at the output 204 is limited to a maximum voltage 10V, whereby 10V is the maximum zener voltage of the second zener diode D2.

Figure 4:
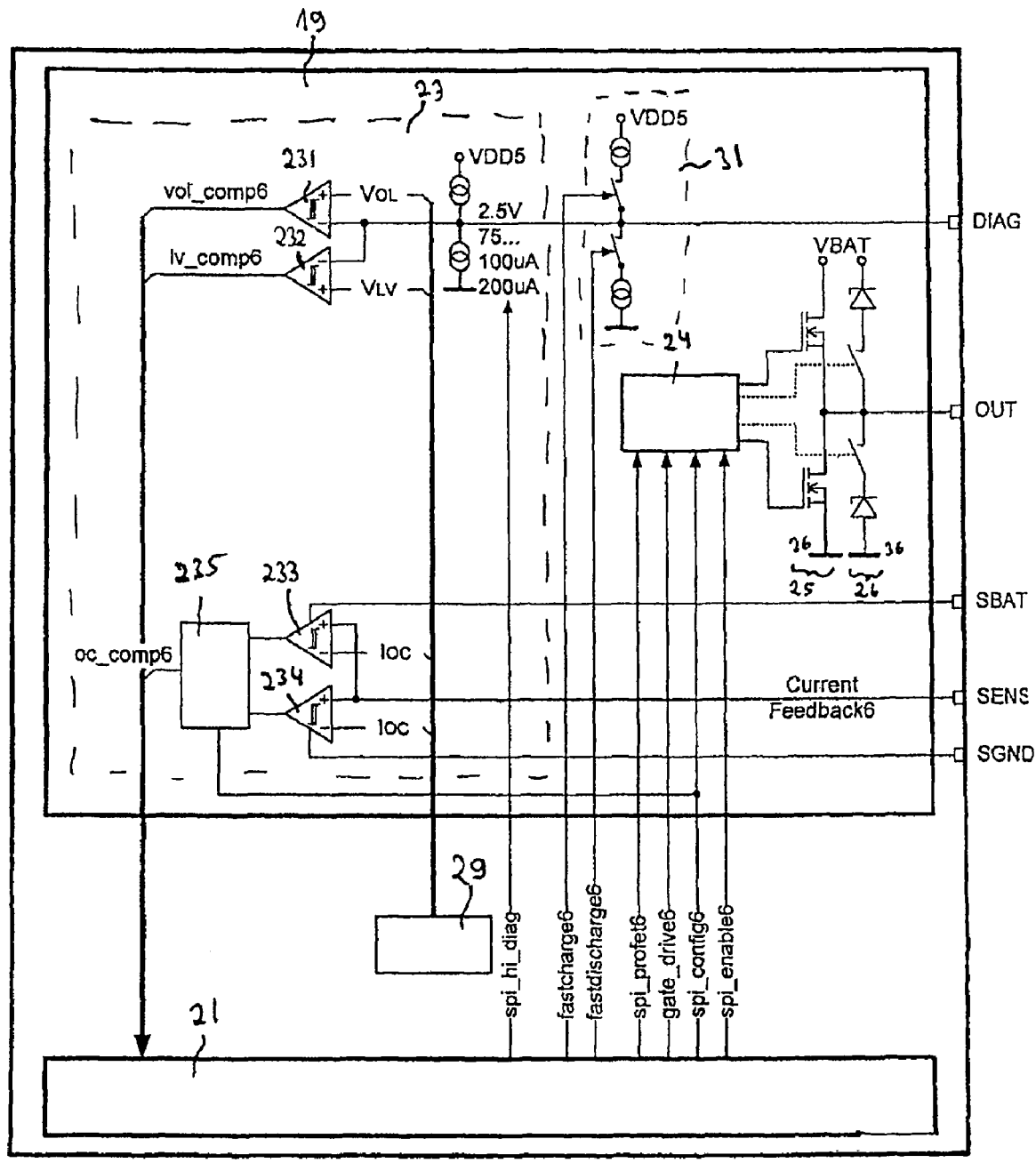
FIG. 4 shows additional details of the control circuit of FIG. 1.

FIG. 4 shows further details of the control circuit 2. The digital block 21 drives the analog block 19, which comprises the pre-driver 24, the push-pull stage 25, a charge/discharge circuit 31 and the diagnosis block 23. The digital block 21 drives the control signals spi_profet6, gate_drive6, spi_config6 and spi_enable6, which are received by the pre-driver 24.

The signal spi_enable6 for example controls whether the output OUT is in tri-state or if it is driven by the push-pull stage 25 actively.

If spi_enable6 is 0, the output signal OUT is in tri-state. If spi_enable6 is 1, the output OUT is active. The digital block 21 also drives the signal fastcharge6 and fastdischarge6 to drive the charge/discharge circuit 31.

The signal driven by the digital block 21 spi_hi_diag controls the bias current for the signal DIAG.

The diagnostic circuit 23 comprises the differential amplifiers 231, 232, 233 and 234. The inverting inputs of the differential amplifiers 231 and 232 receive the feedback signal DIAG, while they receive the bias voltages VOL and VLV at their non-inverting input.

The differential amplifiers 233 and 234 receive the bias current IOC at their inverting inputs and the feedback signal SENS at their non-inverting inputs. The differential amplifier 233 receives the feedback signal SBAT as a reference signal, whereas the comparator 234 receives the signal SGND as a reference signal.

The outputs of the differential amplifiers 233 and 234 are output to the digital comparator-block 235, which outputs the signal oc_comp6 to the digital block 21. The outputs of the differential amplifiers 231 and 232 vol_comp6, v_comp6 respectively, are also output to the digital block 21.

Figure 5:
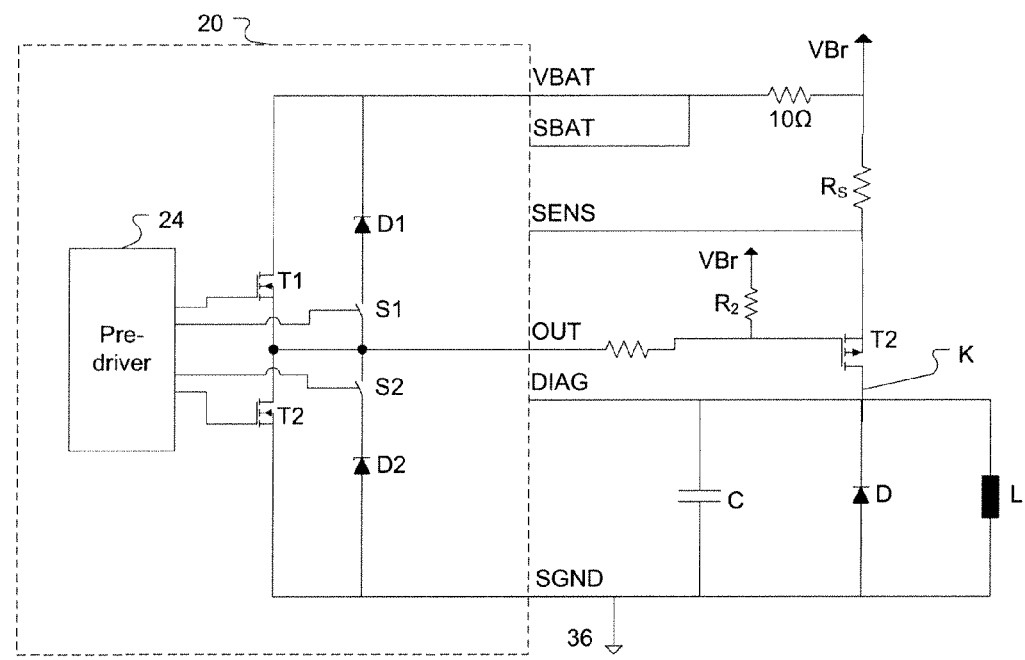
FIG. 5 shows an electronic circuit with a control circuit according to FIG. 2 in a first embodiment.

FIG. 5 shows a first embodiment of the electronic circuit 1 with a control circuit 20 driving a standard p-channel MOSFET-transistor T, which acts as a high-side-switch. The output OUT of the control circuit 20 is coupled through a resistor RI to the gate of the transistor T. The gate is further biased to the battery voltage Vbr through the resistor R2.

The source of transistor T is coupled through a shunt-resistor RS to the battery voltage Vbr. The drain is connected to the node K. An inductive load L, a diode D and a capacitor C are connected in parallel between ground 36 and the node K. The potential at the node K is fed back to the control circuit 20 as the feedback signal DIAG. The feedback signal SGND is connected to ground 36.

The voltage at the source of transistor T is fed back as a signal SENS and the battery voltage as the signal SBAT. The voltage supply node VBAT is coupled to the battery voltage Vbr through a 10 Ohm-resistor. The voltage supply node VBAT is connected to the cathode of the first zener diode D1 and the drain of the first transistor T1 of the control circuit 20. The current through the transistor T is measured by the feedback signals SBAT and SENS. The voltage difference between these signals is measured and divided through the impedance of the shunt-transistor RS.

To switch the transistor T on, a gate-source-voltage of −10 V is provided by the push-pull stage 25. To protect the gate of transistor T from overshoots, the switch S1 is closed.

Figure 6:
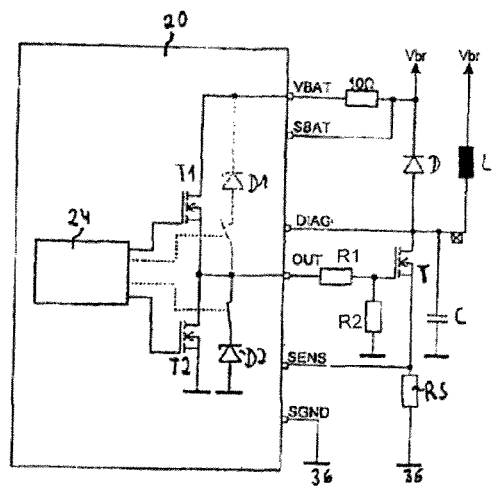
FIG. 6 shows an electronic circuit with the control circuit of FIG. 2 in a second embodiment.

FIG. 6 shows an embodiment where the control circuit 20 drives a standard n-channel power transistor T. The output OUT of control circuit 20 is coupled to the gate of transistor T through the resistor R1, while the gate is also biased to ground 36 by the resistor R2. The source of transistor T is connected to a first terminal of the shunt-resistor RS. The second terminal of the shunt-resistor RS is connected to ground 36. The load L and the diode D are connected in parallel between the battery voltage Vbr and the drain of transistor T.

The feedback signal SBAT is connected to the battery voltage Vbr and the signal SGND is connected to ground. The feedback signal SENS is connected to the source of transistor T and the signal DIAG to the drain of transistor T.

To switch the transistor T on, a gate-source voltage of +10 V is provided.

To measure the current through the transistor T, the voltage of the signal SENS is divided through the impedance of the shunt-resistor RS. If the current through the transistor exceeds a predetermined value, this condition is detected by the diagnosis block 22 which drives the driver circuit 20 to switch the transistor T off to protect the transistor T.

Figure 7:
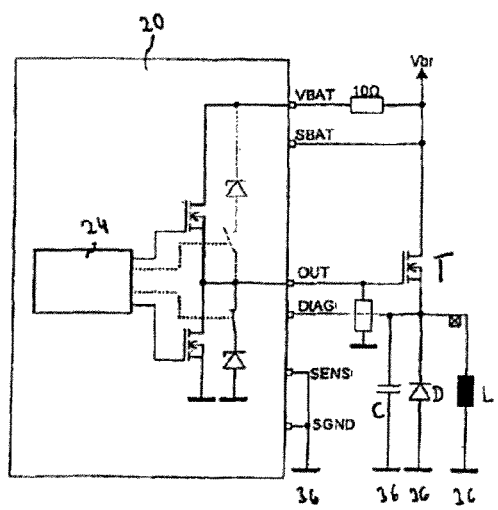
FIG. 7 shows a third embodiment of an electronic circuit with the control circuit of FIG. 2.

FIG. 7 shows in a third embodiment an electronic circuit with a driver circuit 20 driving a protected n-MOSFET-transistor being connected to the load L as a high-side-switch. The protected, in other terms smart, transistor T comprises additional circuitry, which makes sure that the transistor T is not destroyed. Over-current protection is already integrated in the transistor T, so that such a protection does not need to be provided by the control circuit 20. Accordingly, the signal SENS is connected to ground 36. The load L, the diode D and the capacitor C are connected in parallel between the source of the transistor T and ground 36. The source of the transistor T is also connected to the feedback-signal DIAG.

The output OUT is connected to the control input of the transistor T, which is internally connected to the gate of transistor T.

Figure 8:
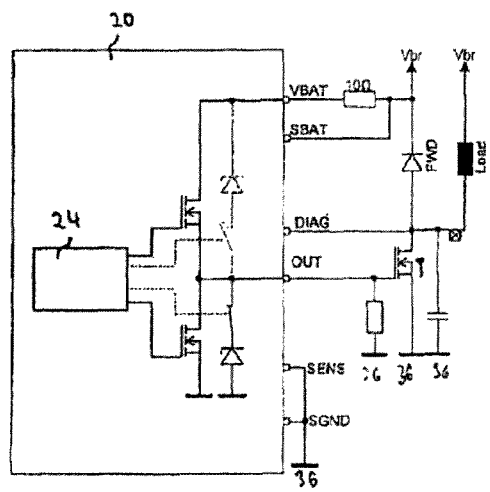
FIG. 8 shows a fourth embodiment of an electronic circuit with the control circuit of FIG. 2.

FIG. 8 shows in a fourth embodiment of an electronic circuit with a control circuit 20 driving a protected n-channel MOSFET-transistor T. The difference to FIG. 6 is, that the output OUT is directly connected to the control input of the transistor T. As in FIG. 7, the feedback signal SENS is connected to ground 36.

FIGS. 5 to 8 show that the same control circuit 20 may be used for a variety of transistor types and circuit configurations like high-side-switch and low-side-switch by programming by the configuration signal ISW the right voltage level to switch the transistor T and to connect the output to the right protection circuits.

What is claimed is:

1. An integrated circuit comprising a control circuit for controlling a power field-effect transistor, the integrated circuit comprising:
   a first input for receiving a control signal,
   an output to switch the field-effect transistor on and off,
   a driver circuit for providing a voltage level at the output in response to the control signal,
   a second input for receiving a configuration signal, the configuration signal for configuring the voltage level, which is provided by the driver circuit in response to the control signal, wherein the configuration signal received by the second input indicates whether the field-effect transistor is an n-channel transistor type or a p-channel transistor type, and
   a third input for receiving a feedback signal from a terminal of the field-effect transistor.

2. The integrated circuit according to claim 1, wherein the configuration signal provides information about the type of field-effect transistor.

3. The integrated circuit according to claim 1, wherein the second input receives a serial bus signal.

4. The integrated circuit according to claim 1, further comprising a diagnosis circuit connected to the third input and being configured to measure the current through the load or the voltage of the load, the load being driven by the field-effect transistor.

5. The integrated circuit according to claim 1, further comprising
   a first protection device for preventing undershoots at the output of the driver circuit, being selectively coupled between a first power supply and the output of the driver circuit,
   a second protection device for preventing overshoots at the output of the driver circuit, being selectively coupled between a second power supply and the output of the driver circuit.

6. The integrated circuit according to claim 5, wherein
   the selection of whether the first protection device is coupled between a first power supply and the output of the driver circuit, and
   and the selection of whether the second protection device is coupled between a second power supply and the output of the driver circuit,
   are configurable by the configuration signal.

7. The integrated circuit according to claim 1, further comprising a push-pull stage, with a push transistor to couple the output to a first supply node, and a pull transistor to couple the output to a second supply node.

8. The integrated circuit according to claim 1, comprising a non-volatile memory to store the configuration of the voltage level, which is driven by the driver circuit in response to the control signal.

9. An electronic circuit, comprising:
   a power MOSFET transistor having a gate, a source and a drain, the gate being coupled to an output of an integrated circuit; and
   an integrated circuit including:
      a first input for receiving a control signal,
      an output to switch the power MOSFET transistor on and off,
      a driver circuit for providing a voltage level operable to supply current and voltage sufficient to switch the power MOSFET transistor on and off at the output in response to the control signal, and
      a second input for receiving a configuration signal, the configuration signal for configuring the voltage level provided by the driver circuit in response to the control signal, wherein the configuration signal received by the second input indicates whether the field-effect transistor is an n-channel transistor type or a p-channel transistor type.

10. The electronic circuit according to claim 9,
    wherein the voltage level at the output of the control circuit is programmed so that the gate-source voltage VGS, if the power MOSFET transistor is switched on, meets one of the conditions:
    (I) $8V \leq VGS \leq 10\ V$, and
    (II) $-10V \leq VGS \leq -8\ V$.

11. A method for configuring a control circuit for a power MOSFET-transistor, comprising the steps of:
    providing an electronic circuit comprising:
       an integrated control circuit comprising:
          a first input for receiving a control signal,
          an output to switch the field-effect transistor on and off,
          a driver circuit for providing a voltage level at the output in response to the control signal, and
          a second input for receiving a configuration signal, the configuration signal for configuring the voltage level being provided by the driver circuit in response to control signal, wherein the configuration signal received by the second input indicates whether the field-effect transistor is an n-channel transistor type or a p-channel transistor type, and
       a power MOSFET transistor having a gate, a source and a drain, the gate being coupled to the output of the integrated circuit;

programming the voltage levels at the output of the control circuit by applying a configuration signal at the second input of the control circuit.

12. The method according to claim 11, wherein the voltage level at the output of the control circuit is programmed such for the gate-source voltage VGS, if the power MOSFET transistor is switched on, meets one of the conditions:
(I) $8V \leq VGS \leq 10\ V$, and
(II) $-10V \leq VGS \leq -8\ V$.

13. The method according to claim 11, wherein the integrated circuit further comprises a third input for receiving a feedback signal from a terminal of the field-effect transistor.

14. The method according to claim 11, further comprising the step of providing information about the type of field-effect transistor by the configuration signal.

15. The method according to claim 11, further comprising the step of receiving a serial bus signal by the second input.

16. The method according to claim 12, wherein the integrated circuit further comprises a diagnosis circuit connected to the third input and being configured to measure the current through the load or the voltage of the load, the load being driven by the field-effect transistor.

17. The method according to claim 11, wherein the integrated circuit further comprises:
a first protection device for preventing undershoots at the output of the driver circuit, being selectively coupled between a first power supply and the output of the driver circuit,
a second protection device for preventing overshoots at the output of the driver circuit, being selectively coupled between a second power supply and the output of the driver circuit.

18. The method according to claim 16, wherein
the selection of whether the first protection device is coupled between a first power supply and the output of the driver circuit,
and the selection of whether the second protection device coupled between a second power supply and the output of the driver circuit,
are configurable by the configuration signal.

19. The method according to claim 11, wherein the integrated circuit further comprises a push-pull stage, with a push transistor to couple the output to a first supply node, and a pull transistor to couple the output to a second supply node.

20. The method according to claim 11, wherein the integrated circuit further comprises a non-volatile memory to store the configuration of the voltage level, which is driven by the driver circuit in response to control signal.

* * * * *